US006627387B2

(12) United States Patent
Hsieh et al.

(10) Patent No.: US 6,627,387 B2
(45) Date of Patent: Sep. 30, 2003

(54) METHOD OF PHOTOLITHOGRAPHY

(75) Inventors: Kevin Hsieh, Hsinchu Hsien (TW);
Chih-Yung Lin, Hsinchu Hsien (TW);
Chih-Hsiang Hsiao, Taipei (TW);
Juan-Yuan Wu, Hsinchu (TW); Water Lur, Taipei (TW)

(73) Assignee: United Microelectronics Corp., Hsinchu (TW)

(*) Notice: Subject to any disclaimer, the term of this patent is extended or adjusted under 35 U.S.C. 154(b) by 6 days.

(21) Appl. No.: 09/827,827

(22) Filed: Apr. 5, 2001

(65) Prior Publication Data

US 2002/0031726 A1 Mar. 14, 2002

Related U.S. Application Data

(63) Continuation of application No. 09/072,155, filed on May 4, 1998, now abandoned.

(30) Foreign Application Priority Data

Jan. 26, 1998 (TW) ........................... 87101054 A

(51) Int. Cl.[7] ............................................. G03F 7/26
(52) U.S. Cl. ...................... 430/313; 430/311; 430/312; 430/314; 430/316; 430/317; 430/327; 430/950

(58) Field of Search ................... 430/311, 312, 430/313, 314, 316, 317, 318, 327, 950

(56) References Cited

U.S. PATENT DOCUMENTS

| | | | | | |
|---|---|---|---|---|---|
| 3,945,347 | A | * | 3/1976 | Takemoto et al. | 29/577 |
| 3,976,524 | A | * | 8/1976 | Feng | 156/8 |
| 4,371,598 | A | * | 2/1983 | Medernach et al. | 430/22 |
| 5,270,267 | A | * | 12/1993 | Ouellet | 437/231 |
| 5,443,998 | A | * | 8/1995 | Meyer | 437/241 |
| 5,525,542 | A | * | 6/1996 | Maniar et al. | 437/186 |
| 5,807,660 | A | * | 9/1998 | Lin et al. | 430/313 |
| 5,846,693 | A | * | 12/1998 | Tanaka et al. | 430/311 |
| 5,880,018 | A | * | 3/1999 | Boeck et al. | 438/619 |

\* cited by examiner

*Primary Examiner*—Mark F. Huff
*Assistant Examiner*—Nicole Barreca
(74) *Attorney, Agent, or Firm*—J.C. Patents

(57) ABSTRACT

A method of photolithography. An anti-reflective coating is formed on the conductive layer. An nitrogen plasma treatment is performed. A photo-resist layer is formed and patterned on the anti-reflective coating. The conductive layer is defined. The photo-resist layer is removed. The anti-reflective layer is removed by using phosphoric acid.

20 Claims, 8 Drawing Sheets

METHOD OF PHOTOLITHOGRAPHY

CROSS-REFERENCE TO RELATED APPLICATION

This application is a continuation application of, and claims the priority benefit of, U.S. application Ser. No. 09/072,155 filed on May 4, 1998, now abandoned.

BACKGROUND OF THE INVENTION

1. Field of the Invention

The invention relates to a method of photolithography, and more particularly to a method of photolithography with a nitrogen ($N_2$) treatment after the deposition of an anti-reflective coating (ARC). While removing a photo-resist (PR) layer, oxidation of the ARC is suppressed, so that the alteration of the ARC quality is reduced.

2. Description of the Related Art.

As the integrated circuit (IC) device scales down, the required linewidth becomes narrower and narrower, and the resolution has to be increased. During photolithography, the wavelength of light source for exposure has to be shorter to meet the above requirements. However, as the wavelength of light source decreases, the reflection of silicon becomes more and more serious. The swing effect is thus more and more obvious. To avoid the reflection on the surface of a metal layer, to enhance the accuracy of exposure, and to control the linewidth precisely, an ARC, for example, a silicon-oxy-nitride (SiON), is formed on the surface of poly-silicon or aluminum alloy.

After patterning a poly-silicon layer, the photo-resist layer is removed. However, during deep ultra-violet(UV) photolithography, in case that abnormal exposure happens, the photo-resist layer has to be reworked. To remove the rework photo-resist layer, an oxygen ($O_2$) plasma or sulfuric acid ($H_2SO_4$) and perhydrol ($H_2O_2$) is used. While removing the photo-resist layer by the oxygen plasma or sulfuric acid and perhydrol, the surface of the ARC is oxidized. The characteristics of the ARC, such as the refractive index (n), the decay coefficient (k), and the reflectivity, are altered to change the process condition.

In FIG. 1a to FIG. 1b, a conventional method to define a transistor in an IC is shown. Referring to FIG. 1a, on a substrate 100, a gate oxide layer 102, a poly-silicon layer 104, an ARC 106, and a photo-resist layer 108 are formed in sequence. The material of the ARC 106 includes silicon-oxy-nitride. Using a photo-mask 110, the photo-resist layer 108 is patterned to form a photo-resist mask 108a as shown in FIG. 1b. If the exposure is abnormal during the formation of photo-resist layer, the photo-resist layer 108 has to be removed and reworked Referring to FIG. 1c, using the photo-resist mask 108a as a mask, the gate oxide layer 102, the poly-silicon layer 104, the ARC 106 are etched and patterned to form a gate 104a covered by an ARC 106a.

Referring FIG. 1d, the reworked photo-resist mask 108a is removed by oxygen plasma or sulfuric acid.

Furthermore, the ARC 106a is removed. The ARC is removed for performing the subsequent salicide process without damaging the device. However, there is not a proper method to remove the ARC developed yet A process flow of the above conventional method is shown as FIG. 3a. Referring to FIG. 4a, after the deposition of an ARC, the reflectivity 400 is about 18.7 In case of rework for photo-resist layer by $H_2SO_4+H_2O_2$, the reflectivity 402 is about 165. After removing the reworked photo-resist layer by $O_2$ plasma, the reflectivity 404 is about 15.0.

SUMMARY OF THE INVENTION

It is therefore an object of the invention to provide a method of photolithography to avoid oxidation of the ARC surface during removing the reworked photo-resist layer. Therefore, alteration of the characteristics of the ARC is suppressed.

It is therefore another object of the invention to provide a method of photolithography. The ARC is removed without damaging the device.

To Achieve these objects and advantages, and in accordance with the purpose of the invention, as embodied and broadly described herein the invention is directed towards a method of photolithography. An anti-reflective coating is formed on a conductive layer. An nitrogen plasma treatment is performed. A photo-resist layer is formed and patterned on the anti-reflective coating. The conductive layer is defined. The photo-resist layer is removed.

To achieve these objects and advantages, and in accordance with the purpose of the invention, as embodied and broadly described herein, the invention is directed towards another method of photolithography. Anti-reflective coating is formed on the conductive layer. An nitrogen plasma treatment is performed. A photo-resist layer is formed and patterned on the anti-reflective coating. The conductive layer is defined. The photo-resist layer is removed. The anti-reflective layer is removed by using phosphoric acid.

It is to be understood that both the foregoing general description and the following detailed description are exemplary and explanatory only and are not restrictive of the invention, as claimed

DESCRIPTION OF THE PREFERRED EMBODIMENTS

Figure 1A:
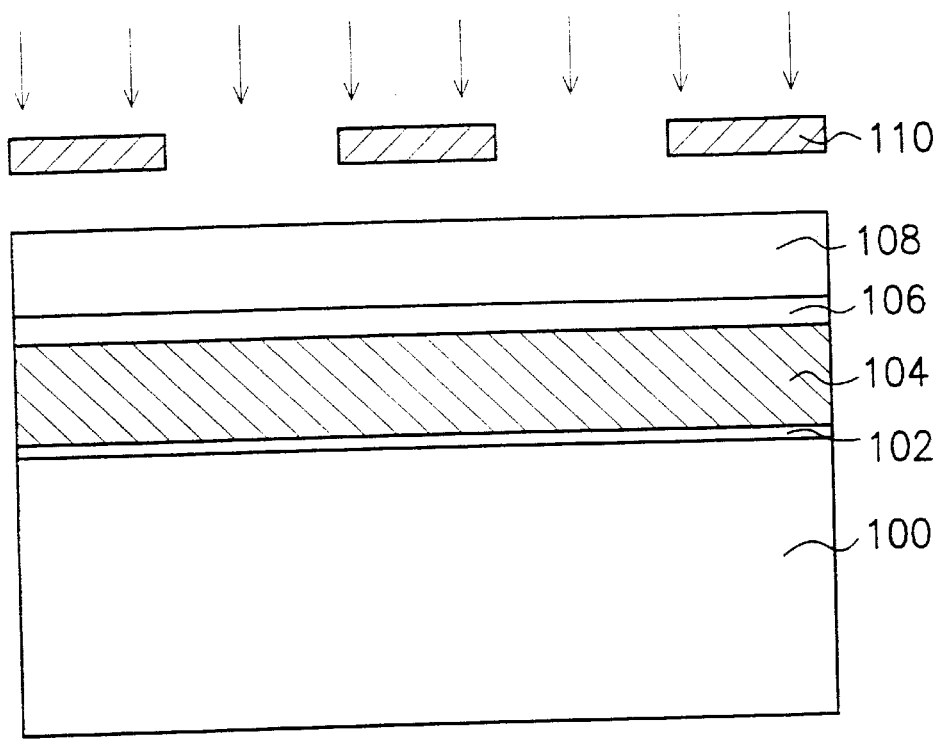
FIG. 1a to FIG. 1d show a conventional method of photolithography.
Figure 1B:
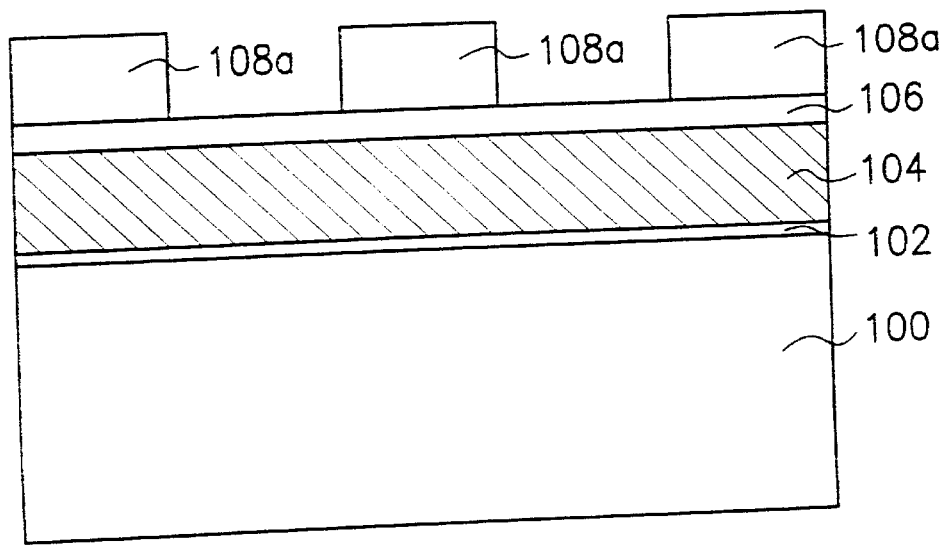
Figure 1C:
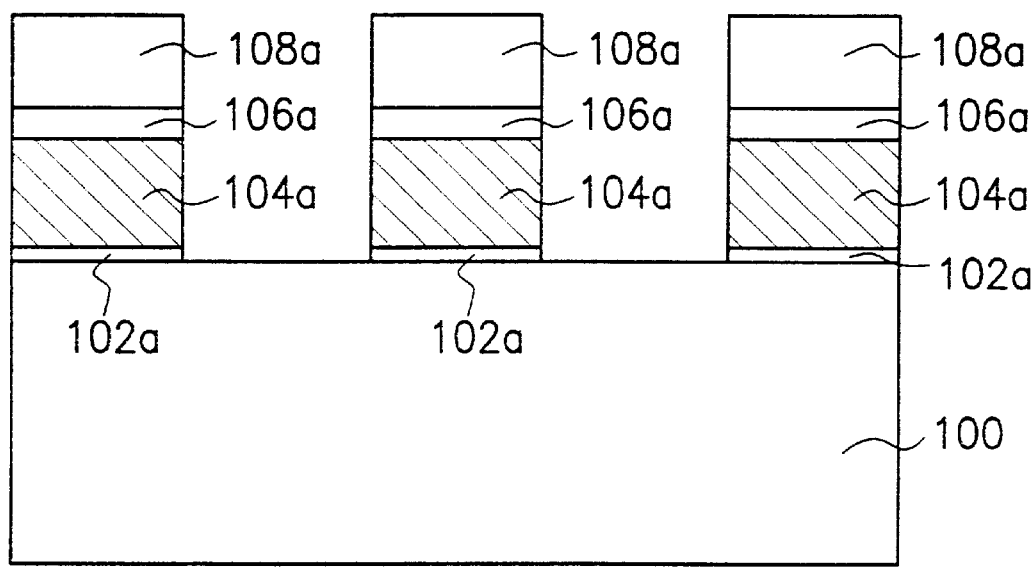
Figure 1D:
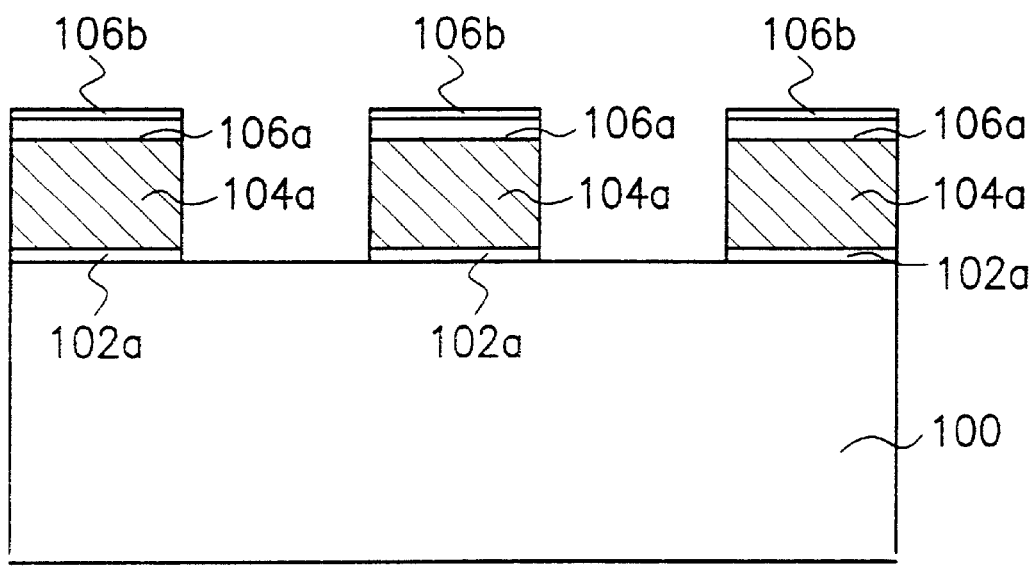
Figure 2A:
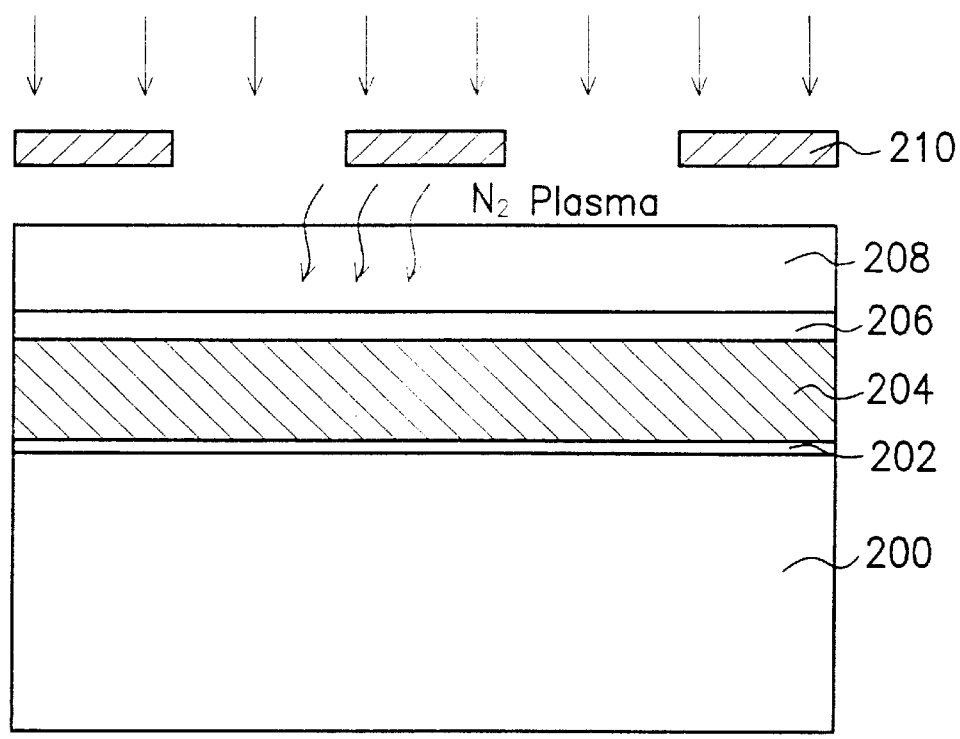
FIG. 2a to FIG. 2d show a method of photolithography in a preferred embodiment according to the invention.
Figure 2B:
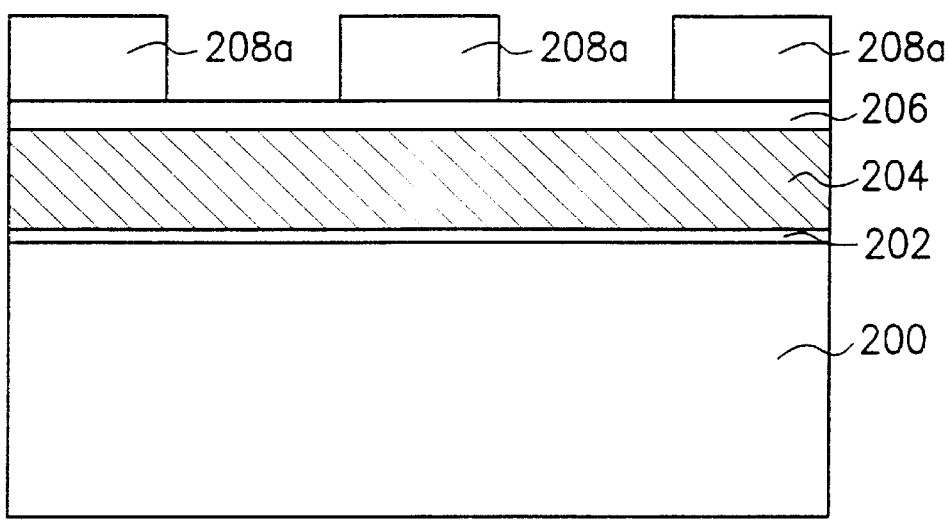

In FIG. 2a. On a semiconductor substrate 200, a gate oxide layer 202 is formed, for example, by thermal oxidation. A conductive layer 204, for example, a poly-silicon layer, a poly-silicide layer, or a metal layer, is formed on the conductive layer 204. On the conductive layer, an ARC 206 is formed. An $N_2$ plasma treatment is performed at about 400° C. under a pressure of about 4 Torr with a power of 700W for about 60 sec A photo-resist layer 208 is formed on the ARC 206 Using a photo-mask 210, the photoresist layer 208 is defined by photolithography with a light source having a wavelength of about 248 nm. In case of abnormal exposure, the photo-resist 208a has to be reworked. Since an $N_2$ plasma has been performed, the surface of the ARC 206 is not oxidized during rework of the photo-resist layer 208. Therefore, the decay coefficient and the reflectivity are not altered to affect the condition of the subsequent photolithography process. The resultant photo-resist layer 208a is shown as FIG. 2b.

Figure 2C:
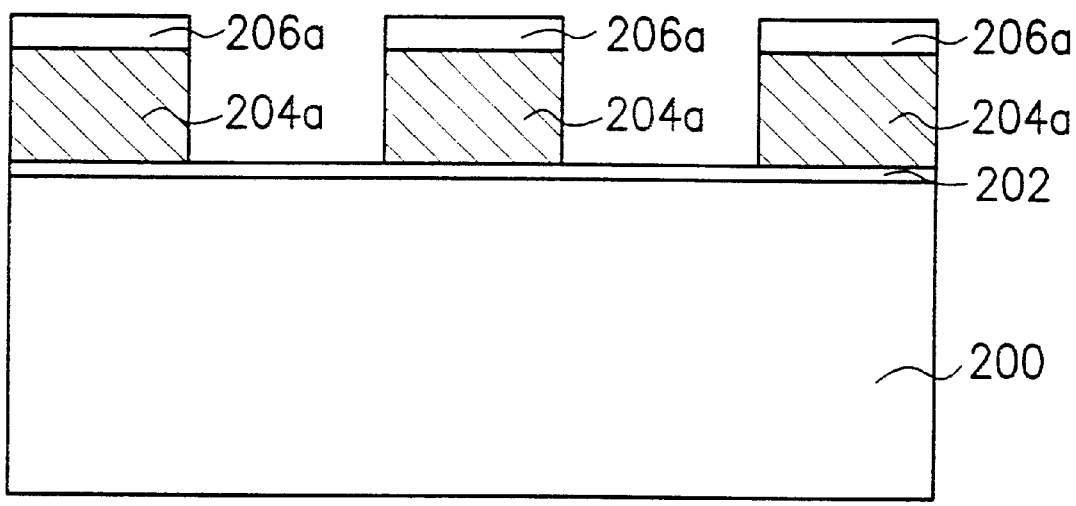

Referring to FIG. 2c, the gate oxide layer 202, the conductive layer 204, and the ARC 206 are etched to define a pattern by using the photo-resist layer 208a as a mask. The gate oxide layer 202, conductive layer 204a, and ARC 206a are shown as the figure. The photo-resist layer 208a is removed by using $O_2$ plasma or sulfuric acid and perhydrol.

Figure 2D:
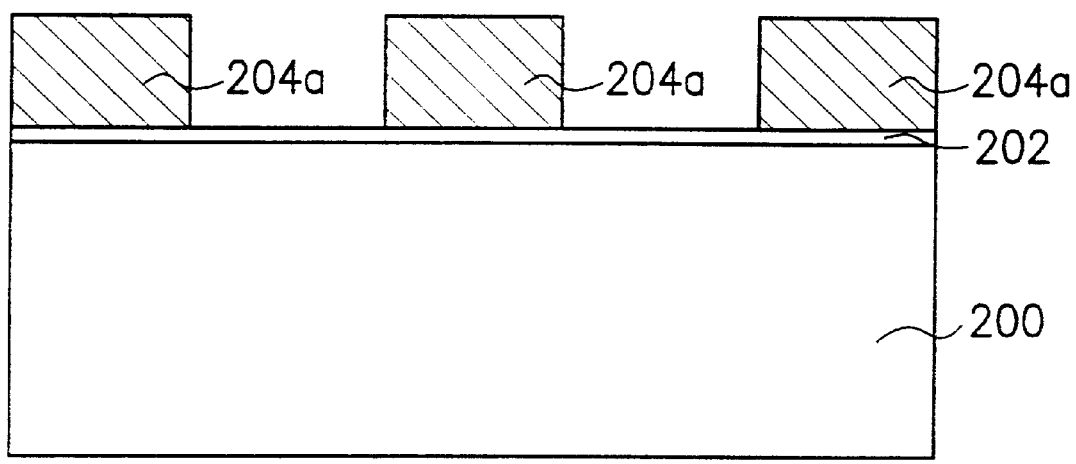

Referring to FIG. 2d, the ARC 206a is removed. In the invention, phosphoric acid is used to remove the ARC 206a without damaging the device.

Figure 3A:
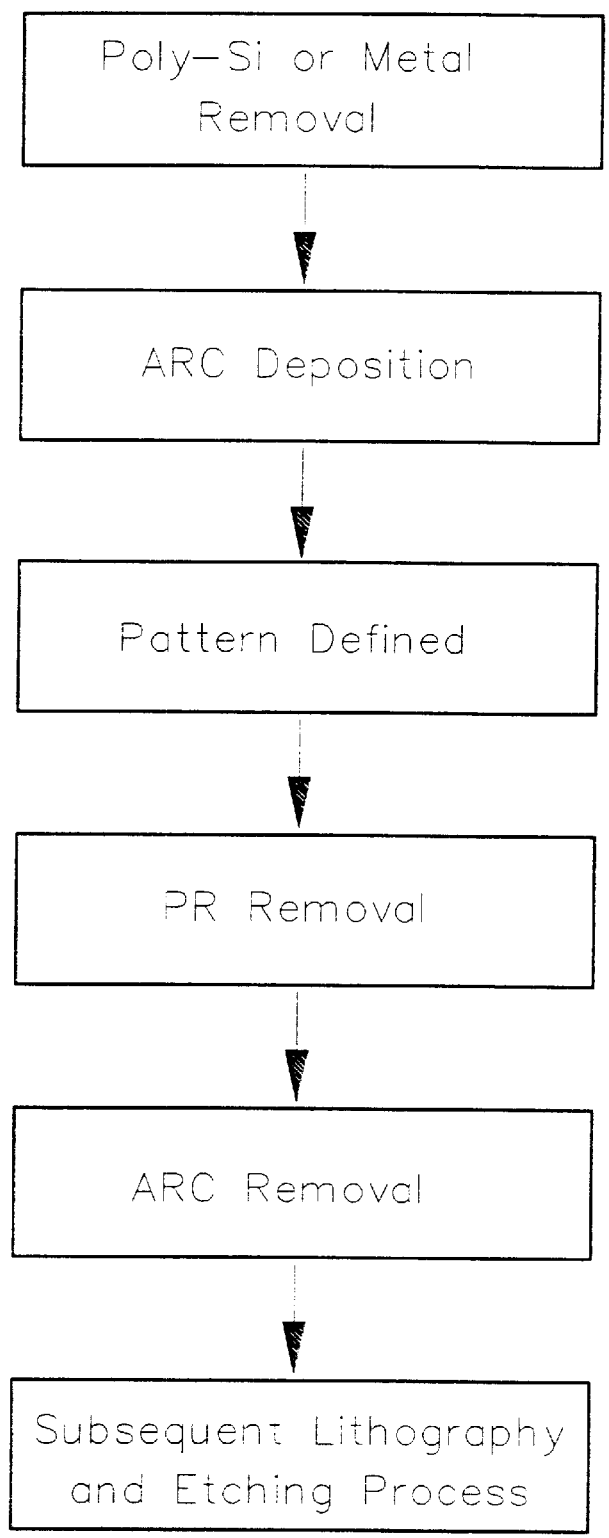
FIG. 3a and FIG. 3b show process flows of the methods of photolithography shown in FIG. 1 and FIG. 2, respectively.
Figure 3B:
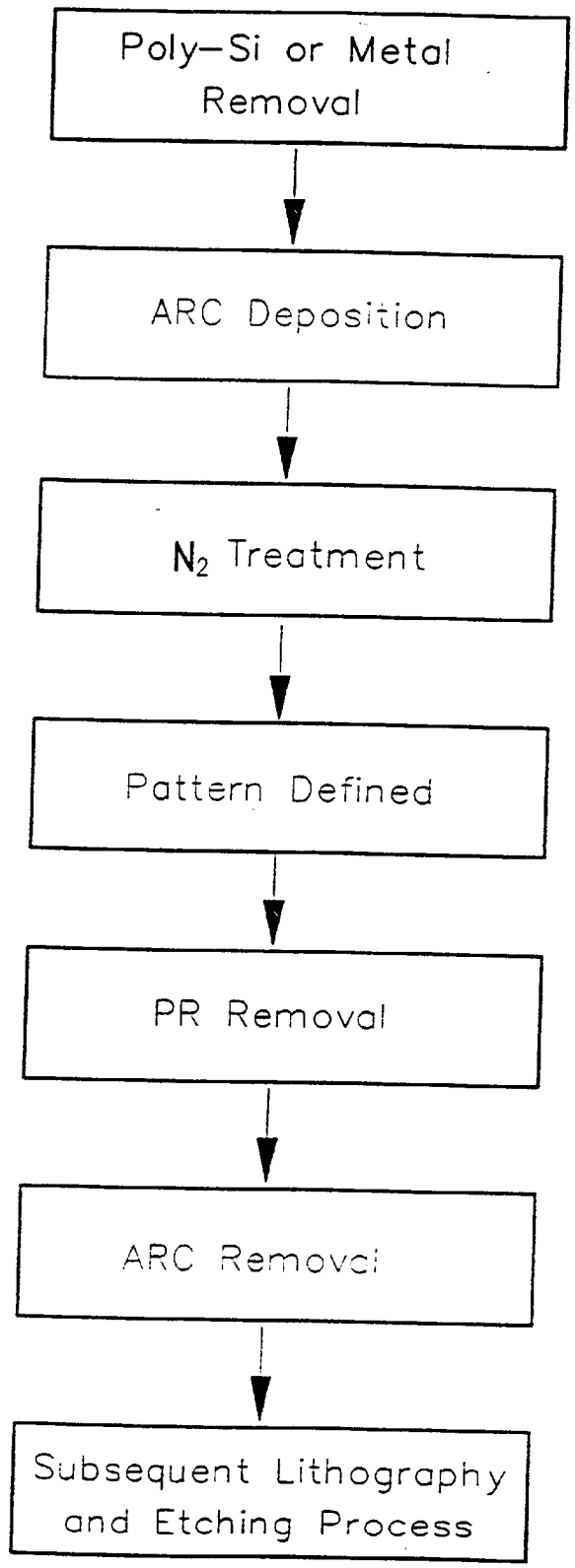

The process flow of the above method of photolithography is shown as FIG. 3b. As shown in the figure, an $N_2$ plasma treatment is performed after the formation of an ARC. With the $N_2$ plasma treatment, the surface of the ARC is not oxidized durino removing the reworked photo-resist layer by $H_2SO_4$ and $H_2O_2$.

Figure 4A:
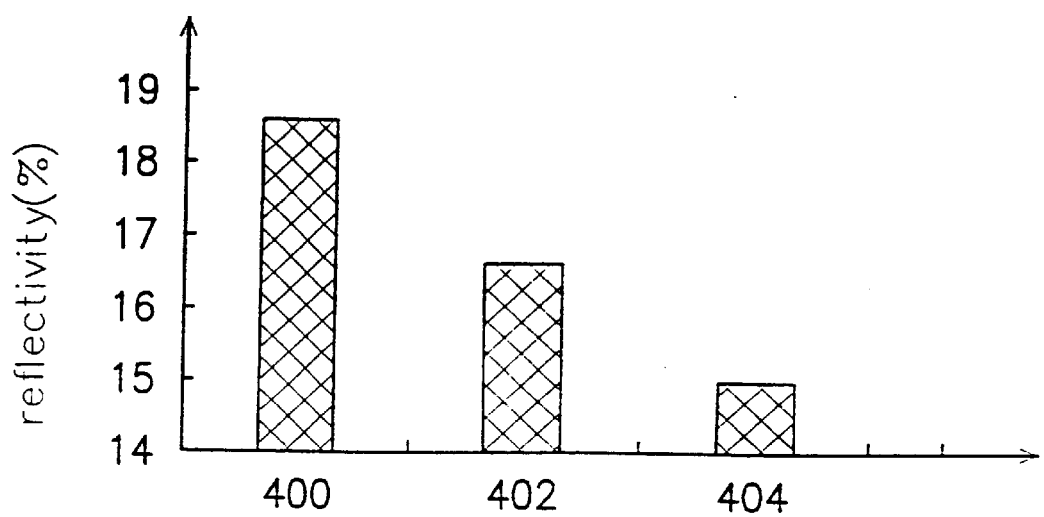
FIG. 4a shows the reflectivity of different stage in the method shown in FIG. 1a to FIG. 1d.
Figure 4B:
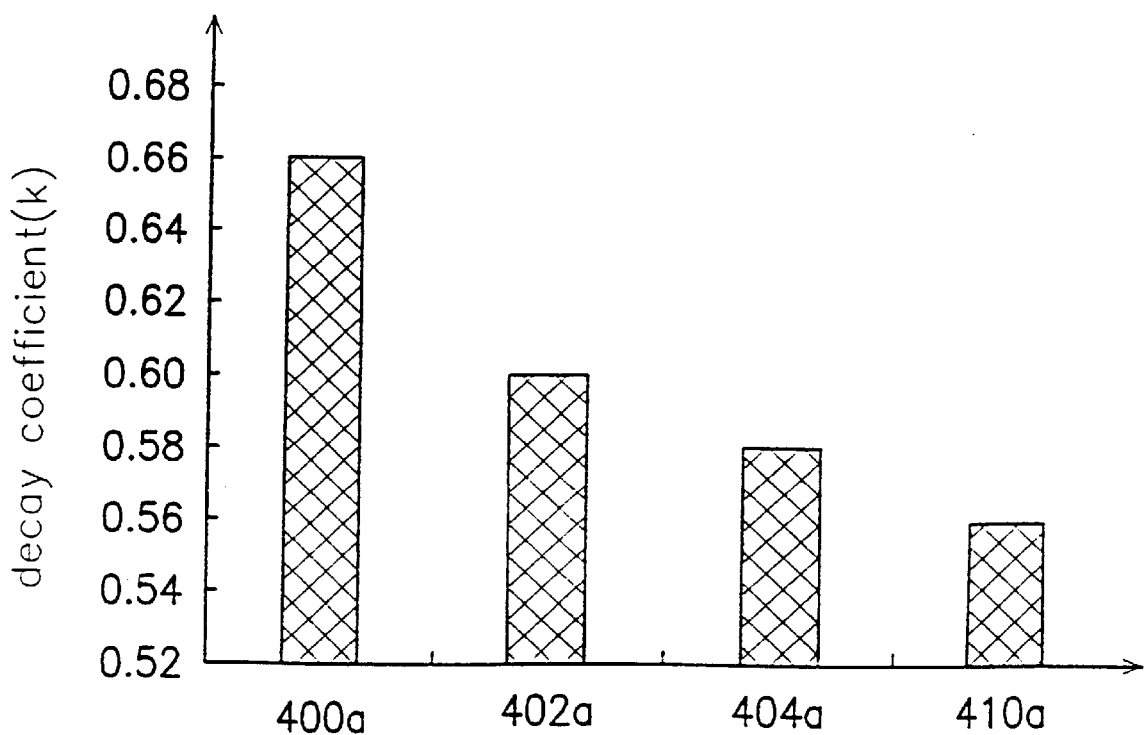
FIG. 4b shows the decay coefficient of different stage in the method shown in FIG. 2a to FIG. 2d.

Referring to FIG. 4b, after deposition of the ARC, the decay coefficient 400a is about 0.66. After rework of the photo-resist layer, the decay coefficient 402a is about 0.60. Thus, 9.1% of the decay coefficient is decreased. With the $N_2$ plasma treatment, the decay coefficient 404a is about 0.58. After the $N_2$ plasma treatment and the rework of the photo-resist layer, the decay coefficient 410a is dropped to 0.57. Only about 1.7% of the decay coefficient is dropped. It is obvious that with the $N_2$ plasma treatment, the alteration of the characteristic of the ARC is moderated.

Figure 5:
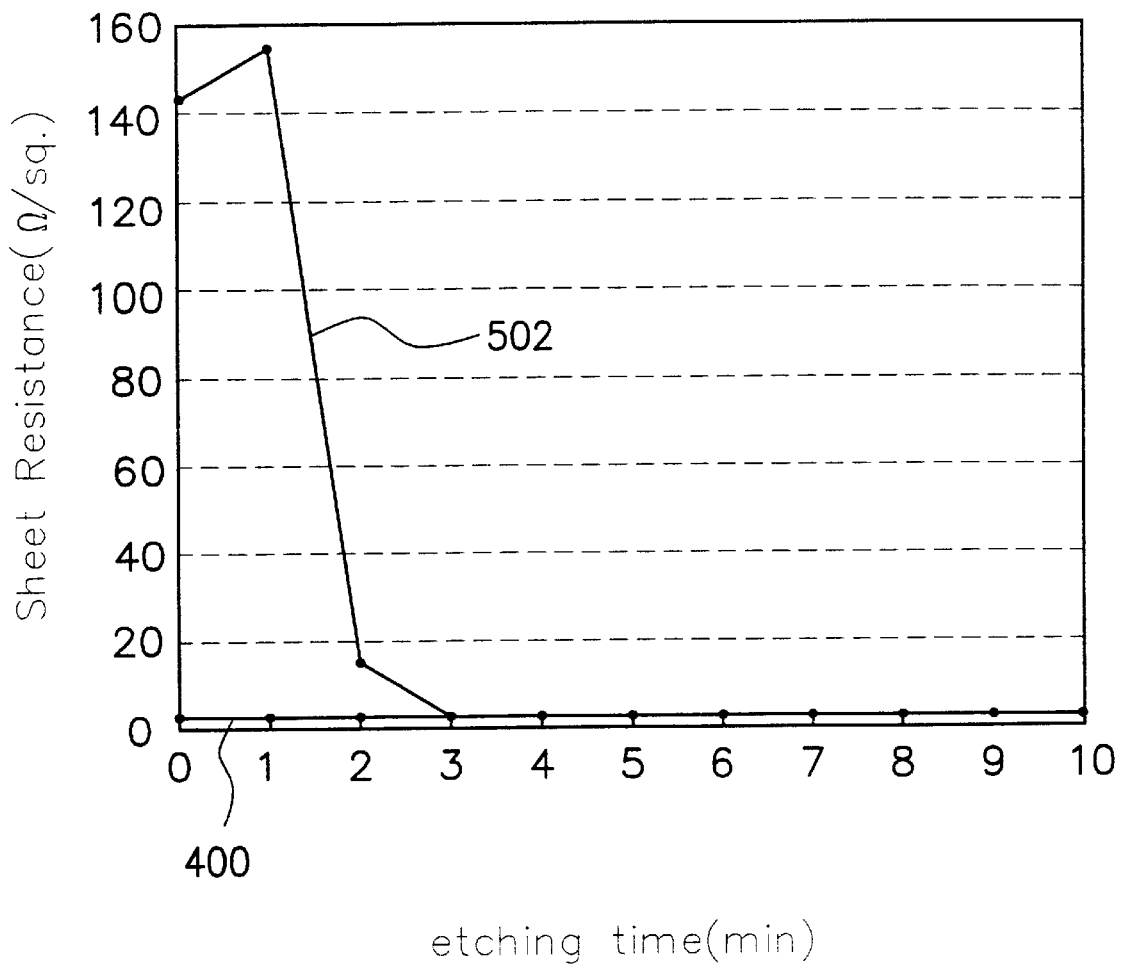
FIG. 5 shows a relationship between the sheet resistance and the etching time in the method shown in FIG. 2a to FIG. 2d

In FIG. 5, a relationship between the sheet resistance of a titanium suicide and the etching time is shown. The curve 400 is the sheet resistance without the formation of an ARC, and the curve represents the sheet resistance with the formation of an ARC. As shown in the figure, after three minutes, the sheet resistance for both curve become very

What is claimed is:

1. A method of photolithography, wherein a material layer to be patterned is provided on a substrate, the method comprising:
    forming an anti-reflective coating on the material layer, wherein the anti-reflective coating comprises a silicon-oxy-nitride layer;
    performing a nitrogen plasma treatment on the anti-reflective coating, for preventing a surface of the anti-reflective coating from being oxidized during a subsequent removal of a reworked photo-resist layer; and
    forming and patterning a first photo-resist layer on the anti-reflective coating, wherein portions of the treated anti-reflective coating are exposed, when the patterned first photo-resist layer needs to be reworked, performing substeps comprising; removing the patterned first photo-resist layer;
    forming a second photo-resist layer on the treated anti-reflective coating; patterning the second photo-resist layer to expose portions of the treated anti-reflective coating;
    removing portions of the treated anti-reflective coating and the material layer using the second photo-resist layer as a mask; and removing the second photo-resist layer.

2. The method according to claim 1, wherein the material layer includes a poly-silicon layer.

3. The method according to claim 1, wherein the material layer includes a poly-silicide layer.

4. The method according to claim 1, wherein the material layer includes a metal layer.

5. The method according to claim 1, wherein after the step of removing the second photo-resist layer, sequentially removing the treated anti-reflective layer.

6. The method according to claim 5, the anti-reflective layer is removed by phorsphoric acid.

7. The method according to claim 1, wherein the nitrogen treatment is performed for 60 seconds.

8. The method according to claim 7, wherein the nitrogen treatment is performed at 400° C.

9. The method according to clam 8, wherein the nitrogen treatment is performed with a pressure of 4 Torr.

10. The method according to claim 9, wherein the nitrogen treatment is performed with a power of 700 W.

11. The method according to claim 1, wherein the first photo-resist layer is removed by $O_2$ plasma.

12. The method according to claim 1, wherein the first photo-resist layer is removed by $H_2SO_4$ and $H_2O_2$.

13. A method of photolithography comprising:
    forming an anti-reflective coating on a conductive layer;
    performing a nitrogen plasma treatment on the anti-reflective coating for preventing a surface of the anti-reflective coating from being oxidized during a subsequent removal of a reworked photo-resist layer;
    forming a patterned first photo-resist layer on the treated anti-reflective coating;
    removing the patterned first photo-resist layer;
    forming a second photo-resist layer on the treated anti-reflective coating after the patterned first photo-resist layer is removed, when the patterned first photo-resist layer needs to be reworked;
    patterning the second photo-resist layer to expose portions of the treated anti-reflective coating;
    removing portions of the treated anti-reflective coating and the conductive layer by using the patterned second photo-resist layer as a mask; and
    removing the second photo-resist layer.

14. The method according to claim 13, wherein the anti-reflective coating is silicon-oxy-nitride layer.

15. The method according to claim 13, wherein the nitrogen treatment is performed at 60 seconds.

16. The method according to claim 15, wherein the nitrogen treatment is performed at 400° C.

17. The method according to claim 16, wherein the nitrogen treatment is performed with a pressure of 4 Torr.

18. The method according to claim 17, wherein the nitrogen treatment is performed with a power of 700 W.

19. The method according to claim 13, wherein the first photo-resist layer is removed by $H_2SO_4$ and $H_2O_2$.

20. The method according to claim 13, wherein the first photo-resist layer is removed by $O_2$ plasma.

* * * * *